March 9, 1965 D. L. WHITE 3,173,100

ULTRASONIC WAVE AMPLIFIER

Filed April 26, 1961 3 Sheets-Sheet 1

INVENTOR.
D. L. WHITE
BY George S. Indig
ATTORNEY

ULTRASONIC WAVE AMPLIFIER

Filed April 26, 1961

INVENTOR.
D. L. WHITE
BY
ATTORNEY

March 9, 1965 D. L. WHITE 3,173,100

ULTRASONIC WAVE AMPLIFIER

Filed April 26, 1961 3 Sheets-Sheet 3

INVENTOR.
D. L. WHITE
BY George S. Indig
ATTORNEY 3,173,100
ULTRASONIC WAVE AMPLIFIER
Donald L. White, Mendham, N.J., assignor to Bell Telephone Laboratories, Incorporated, New York, N.Y., a corporation of New York
Filed Apr. 26, 1961, Ser. No. 105,700
13 Claims. (Cl. 330—35)

This invention relates to procedures and devices for modifying acoustic wave signals. It proposes a new electromechanical mechanism for amplifying or attenuating acoustic waves in solid elastic media. This mechanism depends on the interaction of piezoelectric fields generated in the solid by acoustic waves with electrostatic fields simultaneously produced in the body by an external bias source.

Ordinarily, semiconductors are too highly conductive to support an observable piezoelectric field. However, significant piezoelectric effects have recently been observed in certain specially prepared, high resistance semiconductors. Certain of these, specifically ZnO, CdS and AlN, are disclosed in United States Patents Nos. 3,091,707, 3,093,758 and 3,090,876 issued May 28, 1963, June 11, 1963 and May 21, 1963, respectively. Other semiconductors exhibiting significant piezoelectric effects under appropriate conditions are InAs, CdSe, CdTe, GaAs, GaP and ZnS.

It has now been found that an acoustic wave propagating through such a piezoelectric semiconductor medium can be effectively influenced through interaction of the piezoelectric field generated by the acoustic wave with mobile carriers under the influence of an electrostatic field produced in the medium by an external D.C. bias source. This interaction allows for significant attenuation or amplification of the acoustic signal in response to the magnitude and direction of the electrostatic field.

Within the meaning of this invention the word "acoustic" is used to refer to any coherent elastic wave or mechanical wave vibration of any frequency and is intended to include those frequency ranges sometimes called ultrasonic and hypersonic.

An acoustic wave travelling through a piezoelectric medium generates an alternating electric field which travels at the same velocity as the acoustic wave. Since this field is non-uniform, electric currents are generated which tend to accumulate or bunch electrical charges periodically throughout the medium. The bunched charges tend to neutralize the piezoelectric field. When a D.C. voltage is applied to the medium, a periodic electric field is produced by the direct current flowing through regions in which the charge carriers have been bunched. The alternating field produced by the direct current reacts upon the piezoelectric medium causing additional acoustic wave components. These may either enhance (amplify) or diminish (attenuate) the original wave according to certain prescribed variables.

For any given piezoelectric semiconductor material under the influence of a given fixed D.C. field there is a corresponding optimum frequency giving maximum gain (or loss). This frequency of maximum gain may be related to the variables of the system by the formula:

$$\omega=\frac{\frac{1}{\rho\epsilon}}{\frac{v_D}{v_S}-1} \qquad (1)$$

where $\omega$ is the angular frequency of maximum gain, $\rho$ is the resistivity of the piezoelectric material, $\epsilon$ is the dielectric constant multiplied by $8.85\cdot10^{-14}$ farads per cm. (the permittivity of a vacuum), $v_D$ is the average drift velocity of the carriers in the semiconductor responsive to the fixed D.C. field, and $v_S$ is the velocity of sound in the medium. It is readily apparent from Equation 1 that the required condition to achieve amplification is that $v_D$ exceeds $v_S$. Where the drift velocity is less than the velocity of sound in the medium, attenuation occurs.

The drift velocity is dependent upon the material and the magnitude of the D.C. field as follows:

$$v_D=\mu E' \qquad (2)$$

where $\mu$ is the mobility of majority carriers in the semiconductor in $$\frac{cm.^2}{\text{volt-sec.}}$$

and E' is the strength of the D.C. field (volts per cm.) in the direction of propagation of the acoustic wave.

If the drift velocity is less than $v_S$, the term $$\frac{v_D}{v_S}-1$$

in the above formulae is replaced by $$1-\frac{v_D}{v_S}$$

If the direction of the carriers' drift velocity is opposite to the direction of acoustic propagation, this term is replaced by $$1+\frac{v_D}{v_S}$$

Only when the component of $v_D$ is in the same direction as the acoustic propagation and is greater than $v_S$ can amplification occur. Otherwise, the electric field will modify the attenuation.

Vector analysis shows that the drift velocity, $v_D$, in Equation 1 is actually the component of the drift velocity along the direction of propagation of the acoustic wave signal. Thus, it is not essential that the field direction coincide with the direction of the acoustic wave.

It is obvious that since the phenomenon of this invention requires the interaction of a piezoelectric field with a D.C. field, the direction of acoustic wave propagation must be related to a piezoelectric axis of the material so as to generate a piezoelectric field. It is not always accurate to state that as long as the direction of propagation of the acoustic wave signal has a vector component along a piezoelectric axis of the material, a field will be generated. In certain crystal structures opposing fields are generated which cancel each other. Thus, the direction of propagation of the acoustic wave is properly defined as any crystallographic direction which creates or produces a substantial piezoelectric field. The direction of this field necessarily lies along the direction of wave propagation.

It has been found that alteration of the amplitude of acoustic waves can be achieved whenever a drift velocity component, $v_D$, is generated by the influence of the D.C. field. However, for the purposes of non-reciprocal operation according to the principles of this invention, the drift velocity, $v_D$, is preferably at least 5% of the acoustic velocity to provide a preferred magnitude of non-reprocical effect. As previously pointed out, at the point where $v_D>v_S$, amplification occurs.

These relationships, as well as the characteristics of devices operating according to the principles above set forth, will perhaps be better understood when considered in conjunction with the drawings in which.

In Equation 1 it is seen that the numerator, $1/\rho\epsilon$, is generally a fixed characteristic of the material. As will hereinfater be more fully treated, the resistivity, $\rho$, of the material provides a convenient modulating mechanism for certain semiconductor materials which are photosensitive. Otherwise, both the resistivity and dielectric constant are invariable and the acoustic velocity, $v_S$, is generally fixed. Thus, the two remaining variables are the acoustic wave frequency and the draft velocity. Since in Equation 2 the mobility is a fixed characteristic of the semiconductor, the true variable is E', the strength of the field component in the direction of acoustic wave travel.

For general purposes the frequency level of the acoustic wave is given by the signal desired to be modified. Therefore, in ordinary applications, the ratio of $$\omega \text{ to } \frac{1}{\rho\epsilon}$$

in Equation 1 is predetermined and invariable.

Figure 1:
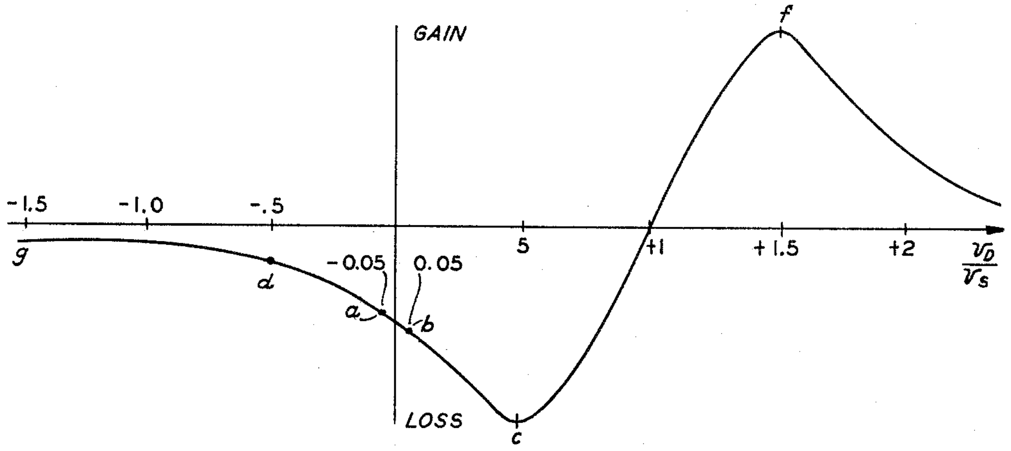
FIG. 1 is a plot of gain versus the ratio $v_D/v_S$ for a given acoustic frequency in a given material.

Referring to FIG. 1 the gain (ordinate) versus $v_D/v_S$ (abscissa) is plotted for a given ratio $$\omega \text{ to } \frac{1}{\rho\epsilon} \text{ of } 2$$

It is also seen that gain occurs for ratios of $$\frac{v_D}{v_S} > 1$$

It is also seen from the figure and from Equation 1 that the maximum gain obtainable with this material at this operating frequency occurs at a ratio $$\frac{v_D}{v_S} = 1.5$$

The maximum gain achievable in complying with the relation of Equation 1 is given by:

$$\text{Gain} = 10\pi \frac{e^2}{\epsilon c} \log_{10} e \frac{1}{\lambda} \qquad (3)$$

where gain is in db/cm., $e^2/\epsilon c$ is the square of the electromechanical coupling coefficient of the material, and $\lambda$ is the wavelength.

FIG. 1 shows that the loss curve is symmetrical with the gain portion of the curve. Accordingly, the frequency relation of Equation 1 also represents the frequency of maximum loss or attenuation which occurs at the point $$1 - \frac{1}{\omega\rho\epsilon}$$

or at .5 in the system of FIG. 1.

It is also seen from FIG. 1 that significant attenuation occurs even at values of $v_D$ below 5% $v_S$. However, attenuation effects in many acoustic devices are generally utilized for non-reciprocal operation as will hereinafter be pointed out. The portion of the curve in the third quadrant of FIG. 1 represents the loss incurred by the acoustic signal for negative ratios of $v_D/v_S$, i.e., where a drift velocity component opposes the direction of acoustic propagation. It is seen that a significant non-reciprocal effect cannot be obtained between the points $a$ and $b$ corresponding to $\pm v_D = 5\% v_S$. Hence, for non-reciprocal devices, the limit previously suggested for the minimum effective velocity ratio restricts the operation to the more acceptable portions of the curve. For instance, a non-reciprocal device operating in the material and at the frequency represented by the curve of FIG. 1 with a velocity ratio $$\frac{v_D}{v_S} = .5$$

would provide a maximum attenuation in the forward direction (point $c$) with substantially less loss (point $d$) in the reverse direction. It should be understood that operation with drift velocity values below the limit prescribed for non-reciprocal operation has significant device application and is considered within the scope of this invention.

The curve of FIG. 1 serves well to illustrate operating points for any acoustic delay line exhibiting gain. A delay line operating with the ratio of $$\frac{1}{\rho\epsilon} \text{ to } \omega \text{ of } .5$$

as characterized by the curve of FIG. 1 and at a $V_D/V_S$ ratio of 1.5 would provide a forward direction operating point at $f$ showing maximum gain and a reverse direction operating point at $g$ showing only a slight loss. Since the forward gain far exceeds the reverse loss, a signal following many forward and reverse reflections, as in a shear mode ultrasonic delay line of the type well known in the art, ultimately shows significant per transit gain by the amount point $f$ exceeds point $g$. This gain is achieved simultaneously with the desired delay. Furthermore, the delay time of the semiconductor medium may also be conveniently adjusted by varying the strength of the D.C. field.

Figure 2:
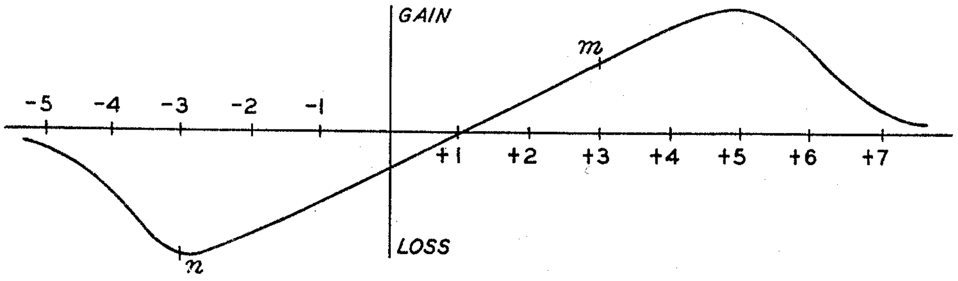
FIG. 2 is a plot similar to FIG. 1 with a different ratio of acoustic frequency to the acoustic constants of the material.

FIG. 2 shows an operating curve particularly adapted for non-reciprocal devices. The coordinates are identical to those of FIG. 1. This curve represents a ratio of $$\frac{1}{\rho\epsilon} \text{ to } \omega \text{ of } 4$$

obtained with a lower resistivity material and/or using a lower operating frequency. Now if the ratio, $V_D/V_S$, is chosen at 3, the forward operating point is $m$ providing significant gain, while the reverse operating point, $n$ provides maximum loss. This operating curve is well suited to non-reciprocal devices such as isolators. As will be appreciated, all operating curves are symmetrical about the point $$\frac{v_D}{v_S} = 1$$

The greater divisions between maxima and minima are obtained with greater ratios of $1/\rho\epsilon$ to $\omega$; i.e., with materials having lower resistivities and dielectric constants and with lower operating frequencies.

Figure 3:
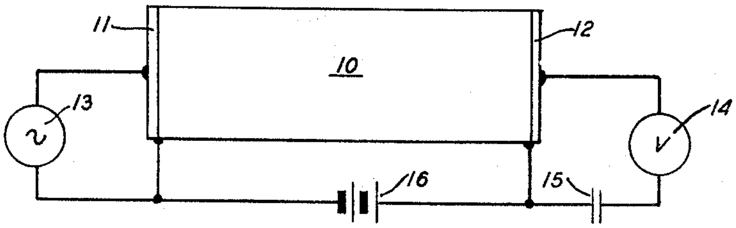
FIG. 3 is a schematic view of an acoustic wave amplifier constructed according to the teachings of this invention.

FIG. 3 shows a typical construction of an acoustic wave amplifier utilizing the principles of this invention. To the ends of body 10, a semiconductor piezoelectric material, are affixed ultrasonic transducers 11 and 12. The transducers are of the type generally used in the art. A preferred form of transducer particularly well adapted for high frequency operation is the depletion layer transducer disclosed in copending application, Serial No. 64,808, filed October 25, 1960. An A.C. signal generated at 13 is impressed across transducer 11, thus creating an acoustic signal which is transmitted through the piezoelectric semiconductor medium 10 to transducer 12. The output electromagnetic signal generated across transducer 12 by the acoustic signal is received by the voltmeter 14 through blocking capacitor 15. The D.C. field which couples with the piezoelectric field generated by the acoustic signal is impressed across the medium 10, as shown, by source 16.

It should be appreciated that while the device in FIG. 3 utilizes an electromagnetic signal to generate the acoustic wave, an acoustic signal may be injected directly into the amplifier, thus eliminating transducer 11. Also, transducer 12 may be eliminated if the desired output is an acoustic signal. The device shown in FIG. 3 is effectively an electromagnetic signal amplifier although the amplification mechanism utilizes an acoustic wave.

Figure 4A:
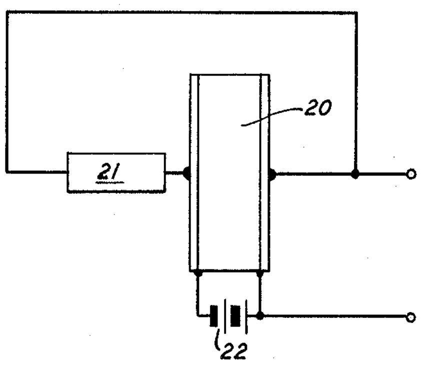
FIG. 4A is a schematic view of an oscillator utilizing the principles of this invention.
Figure 4B:
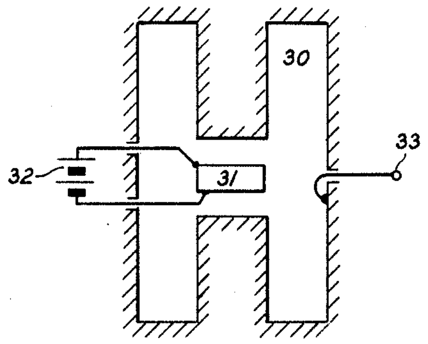
FIG. 4B is a schematic view of another embodiment of an oscillator utilizing a resonant cavity.

FIGS. 4A and 4B illustrate two forms of oscillators operating according to the principles of this invention. In the device of FIG. 4A an electromagnetic signal is amplified in amplifier 20 which is essentially identical to the amplifier of FIG. 3. The output is fed back to the input by the feedback circuit shown which includes reactance 21. The oscillator is tuned with reactance 21 and the D.C. source 22.

FIG. 4B shows an oscillator composed of an amplifier mounted in a resonant cavity 30. The amplifier consists of a piezoelectric semiconductor body 31 with a D.C. field impressed across it by D.C. source 32 in the direction of propagation of the resonant waves through the body. It is seen that this oscillator includes a true acoustic amplifier and no electromechanical transducers are required. At the proper frequency an electrical coupling exists between the acoustic medium and the cavity, thereby producing resonance in the cavity. The cavity oscillations are enhanced by the amplification of the resonant frequency through interaction with the D.C. field in the acoustic medium. The resonant wave appears at output 33.

Figure 5:
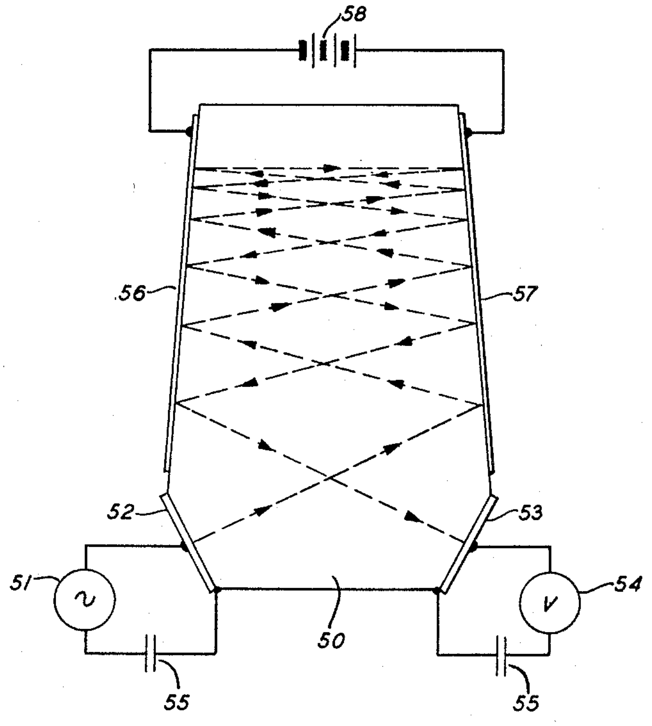
FIG. 5 is a schematic view of an ultrasonic delay line which may simultaneously exhibit gain.

FIG. 5 illustrates a typical ultrasonic delay line utilizing the principles of this invention. The delay medium 50, composed of a piezoelectric semiconductor, is similar in construction to those conventionally employed in the art. A detailed description of the construction of such a delay line and its operation appears in U.S. Patent No. 2,839,731. An electromagnetic signal generated at 51 is fed across piezoelectric transducer 52. The resulting acoustic signal enters the delay medium 50 and traverses a delay path essentially as shown, and emerges through piezoelectric transducer 53. The transducer 53 converts the acoustic signal back to electromagnetic energy which is indicated by voltmeter 54. The capacitors 55 are included to block the D.C. current. Electrodes 56 and 57 bound each reflecting surface of the delay medium, and bias source 58 impresses a D.C. field between these electrodes which has a component lying along the path of the acoustic wave. Referring back to FIG. 1, if the drift velocity component of the carriers along the direction of acoustic wave propagation is chosen such that the operating points on the curve of FIG. 1 are $f$ for the forward direction and $g$ for the reverse direction, the acoustic signal will experience maximum amplification in the forward direction with a minimum attenuation in the reverse direction as previously discussed. Thus, this ultrasonic delay line shows a significant amount of gain.

Figure 6:
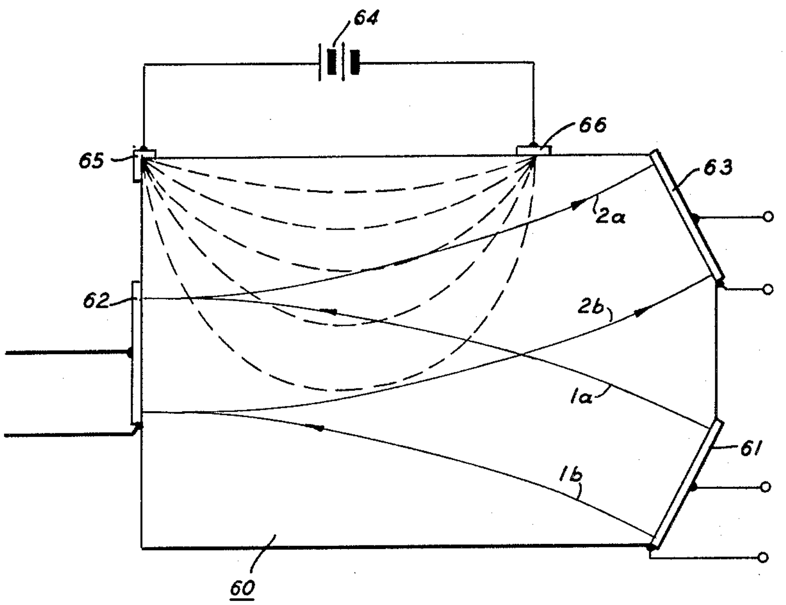
FIG. 6 is a schematic view of an acoustic wave circulator operating according to the teachings of this invention.

FIG. 6 shows a circulator utilizing the principles of this invention. This device has well established uses which generally involve the separation of transmitted signals from signals being received, where both share the same transmission medium. The isolator described previously achieves this to a limited extent but only at the expense or even loss of one of the signals. In the device of FIG. 6 the piezoelectric semiconductor medium 60 includes three ultrasonic transducers 61, 62 and 63, disposed as shown. It functions to maintain the separation between a signal injected at transducer 61, to be transmitted along the conducting line attached to 62, from a signal received at transducer 63 through the common transmission line attached at transducer 62. This effect is achieved due to the field established in the medium 60, by D.C. source 64 and electrodes 65 and 66. This field provides a diminishing intensity from one side of the medium 60 to the other as shown. Thus, since the velocity of sound in medium 60 depends upon the electric field intensity, the non-uniform field causes the waves to refract. Accordingly, a wave indicated by rays 1*a* and 1*b* injected at transducer 61 is bent toward transducer 62. However, a wave indicated by 2*a* and 2*b*, injected at 62 is influenced by a field of opposite direction and is bent toward transducer 63. As is seen, this device is non-reciprocal in that no acoustic wave can retrace its prior path. Appropriate operating points for operation of this device would be point $f$ (FIG. 1) for the direction between 61 and 62, and corresponding point $g$ (FIG. 1) for the reverse direction. Using these points the signal being transmitted from transducer 61 to transducer 62 would be significantly amplified while the signal received from the transducer 62 to the receiver attached at transducer 63 would be only slightly attenuated. This circulator, accordingly, functions additionally as an amplifier of the signal to be transmitted.

Figure 7:
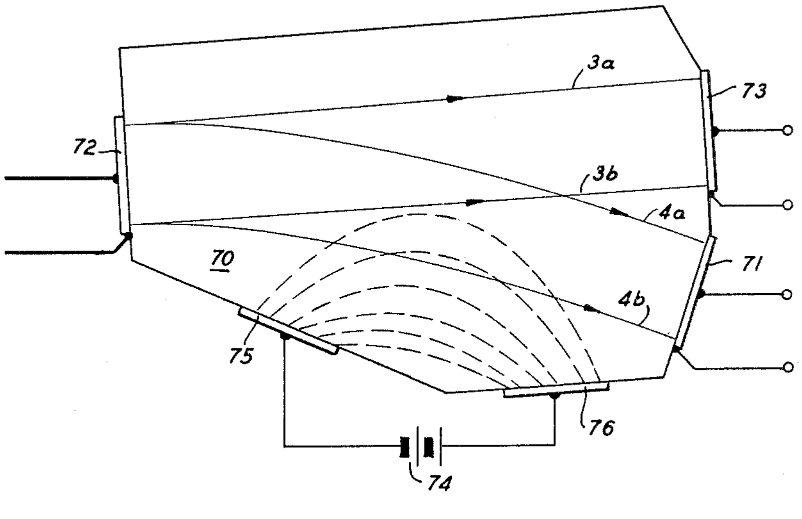
FIG. 7 is a schematic view of an acoustic wave switch similar in construction and operation to the device of FIG. 6.

FIG. 7 shows a switching device operating according to the principles of the circulator of FIG. 6. The device construction is similar to that of FIG. 6. Semiconductor body 70 carries three piezoelectric transducers 71, 72 and 73 disposed as shown. The transducer 73 is essentially opposite to the transducer 72. D.C. source 74 and electrodes 75 and 76 establish the desired field. In operation an acoustic signal generated at transducer 72 normally traverses the path indicated by rays 3*a* and 3*b* and is received at transducer 73. However, upon application of the D.C. field at source 74, the wave is refracted and assumes a direction corresponding to rays 4*a* and 4*b* and is received at transducer 71.

The following examples are illustrative embodiments of particular materials and procedures for obtaining devices of this invention. Each example employs the operating curve of FIG. 1. Using these examples devices may be constructed to achieve any of the operating points on the curve of FIG. 1. These operating points, when properly chosen as previously discussed, may be used for any of the devices described herein.

*Example I*

A single crystal of GaAs, having a resistivity of 1000 ohm-cm. is cut with a 3 mm. cross section and 2 cm. length with the length extending in the (111) crystallographic direction. Piezoelectric depletion layer transducers are then formed in each end in the manner fully described in application Serial No. 64,808, filed October 25, 1960. The device construction is identical to that of FIG. 3. To obtain the ratio of $$\frac{1}{\rho\epsilon} \text{ to } \omega \text{ of } 0.5$$

as the curve of FIG. 1 represents, the operating voltage is calculated from Equation 1. In this example the GaAs has a resistivity of 1000 ohm-cm. and a dielectric constant of 11. Thus, the value $1/\rho\epsilon$ in Equation 1 is set at $10^9$/sec. Therefore, to obtain a ratio $$\frac{1}{\rho\epsilon} \text{ to } \omega \text{ of } 0.5$$

the operating frequency (angular) $\omega = 2\times10^9$ rad./sec. or 320 megacycles per second. From Equation 1 the ratio of drift velocity to acoustic velocity is calculated as:

$$.5=\frac{v_D}{v_S}-1$$

$$\frac{v_D}{v_S}=1.5$$

From the velocity of sound in this material, $5.6\times10^5$ cm./sec., the drift velocity is calculated as $8.4\times10^5$ cm./sec. Equation 2 relates the drift velocity to the required electric field as:

$$v_D=\mu E' \quad (2)$$

Here the entire velocity component lies in the direction of the acoustic wave propagation (FIG. 3). Thus, Equation 2 becomes:

$$v_D=\mu E$$

where E is the field, and $\mu$, the mobility of carriers in this material, is $$4{,}000\ \frac{\text{cm.}^2}{\text{volt-sec.}}$$

The field E is then:

$$E=\frac{840{,}000}{4{,}000}$$
$$=210 \text{ volts/cm.}$$

Thus, the transducers at each end of the crystal are adjusted for an operating frequency of 320 mc. The D.C. source, supplying the 420 volt potentials required for the 2 cm. sample, is connected as indicated in FIG. 3. The operating points on the curve of FIG. 1 are $f$ and $g$. The high frequency signal is impressed across the input transducer 11, in FIG. 3, and detected across output transducer 12. The output signal is amplified approximately 20 db. This device, therefore, operating at this designated frequency and D.C. potential, provides a gain of approximately 10 db/cm.

*Example II*

A single crystal of CdS is cut with a cross-section of 1 mm. x 1 mm. and a length of 2 mm. with its length extending in the $c$-direction. The device structure is the same as that in Example I. This material, with a resistivity of 300 ohm-cm. has a $1/\rho\epsilon$ value of $3.9\cdot 10^9$/sec. Hence, to achieve a ratio of $$\omega \text{ to } \frac{1}{\rho\epsilon} \text{ of } 2$$

which is the basis for the curve of FIG. 1, the operating frequency, $\omega$, is $7.8\cdot 10^9$ radians/sec. or $f=1{,}250$ mc. In this material and crystallographic direction $v_S=4.5\cdot 10^5$ cm./sec. For a ratio of drift velocity to the sound velocity of 1.5 (as calculated in the previous example) $v_D$ must equal $6.7\cdot 10^5$ cm./sec. For CdS, $\mu=300$ cm./volt-sec., the field required to give this drift velocity (calculated from Equation 2 is 440 volts.

The square of the coupling coefficient $$\left(\frac{e^2}{\epsilon c}\right)$$

for this CdS is .07, $1/\lambda$ in this example is $3.6\cdot 10^3$. The gain for this device is 65 db or 330 db/cm.

A further control parameter, as previously pointed out, and which is apparent from Equation 1, is the resistivity of the material. Since some semiconductors, for instance GaAs and CdS, are photosensitive, i.e., their resistivities vary with the intensity of incident illumination. Thus, an appropriate variable light source, with which the art is well acquainted, may be employed to vary the resistivity and attendant gain. A more thorough treatment of the variation of resistivity with illumination in piezoelectric semiconductors will be found in application Serial No. 23,441, filed April 20, 1960. Useful resistivities for any of the semiconductor materials previously indicated as appropriate for this invention are in the range of 1 ohm-cm. to $10^6$ ohm-cm. As seen from Equation 1, the lower resistivity materials provide higher frequency devices.

Whereas single crystal mediums are preferred, polycrystalline piezoelectric semiconductors are acceptable.

The frequency range in which the devices of this invention are adapted to operate is from 200 mc. to over 100 kmc. However, at high frequencies, since the carrier bunches corresponding to compressions and dilations (or shear wave deformations) of the acoustic medium are so close together, diffusion of these carriers becomes a significant problem. The frequency threshold at which carrier diffusion reduces the gain by 50% can be calculated from the formula:

$$f_D=\frac{1}{2\pi}\frac{v_S^2}{D}\left(\frac{v_D}{v_S}-1\right) \qquad (4)$$

where $f_D$ is the frequency threshold at which carrier diffusion reduces the gain by 50%, $v_S$ is the velocity of sound, and D is the diffusion coefficient given by:

$$D=\mu T\left(\frac{k}{q}\right) \qquad (5)$$

where $\mu$ is the carrier mobility in $$\frac{\text{cm.}^2}{\text{volt-sec.}}$$

T is the absolute temperature in ° K., $k$ is Boltzman's constant$=1.38\cdot 10^{-16}$ ergs/° K., and $q$ is the electron charge$=1.6\cdot 10^{-19}$ coulombs.

For zinc oxide and cadmium sulfide, at $v_D=2v_S$, $f_D$ is approximately 10,000 mc./sec. at room temperature; since these materials are so strongly piezoelectric, significant amplification may be obtained at frequencies well in excess of this value.

It will be obvious to those skilled in the art that in transmitting very high frequency electromagnetic signals, wave guides or similar handling of the signal must be employed. The figures are to be considered schematic in this regard, and when V.H.F. and microwave frequencies are contemplated, the wires appearing in the figures are to be understood as indicating the necessary transmission structures as are well known in the art.

The foregoing examples are offered as exemplary of the multitude of possible device designs which depend upon the basic teachings of this invention and are not to be construed as limiting the invention. Various other modifications and embodiments will become apparent to those skilled in the art. However, all such devices, which are characterized in whole or part by the basic phenomenon through which this invention has advanced the art, are properly considered within the spirit and scope of this invention.

What is claimed is:

1. An electromechanical device comprising a unitary body having both piezoelectric and semiconductor properties, means for propagating an acoustic wave signal through said body thereby generating a significant piezoelectric field, and means including a D.C. bias source for simultaneously establishing a D.C. field in said body, said field having a magnitude and direction such that the drift velocity of the carriers responsive to said field has a velocity component along the axis defined by the direction of acoustic wave propagation whereby the carriers of said D.C. field interact with the said acoustic wave in a manner so as to modify the amplitude of the acoustic wave.

2. The device of claim 1 wherein said drift velocity component is at least 5% of the velocity of the acoustic signal.

3. The device of claim 1 wherein the piezoelectric semiconductor is selected from the group consisting of GaAs, GaP, ZnO, CdS, InAs, ZnS, CdTe, AlN and CdSe.

4. The device of claim 1 wherein the component of the said D.C. field along the said axis opposes the said acoustic wave signal.

5. The device of claim 1 wherein the means for propagating an acoustic wave signal through said body is a resonant cavity.

6. An acoustic wave amplifier comprising a unitary body having both piezoelectric and semiconductor properties, means for propagating an acoustic wave signal through said body thereby generating a significant piezoelectric field and means including a D.C. bias source for simultaneously establishing a D.C. field in said body, said field having a magnitude and direction such that the drift velocity of the carriers responsive to said field has a velocity component in the direction of acoustic wave propagation which is greater than the velocity of the acoustic signal whereby the said carriers of the D.C. field interact with the acoustic wave to increase the amplitude of the acoustic wave.

7. The amplifier of claim 6 wherein the means for propagating the acoustic wave signal through said body includes an ultrasonic piezoelectric transducer attached to said piezoelectric semiconductor at the point of injection of the acoustic wave.

8. The amplifier of claim 7 additionally including an ultrasonic piezoelectric transducer in combination with said piezoelectric semiconductor for reconverting said acoustic signal after amplification back to an electrical signal.

9. The amplifier of claim 6 wherein the means for propagating the acoustic wave signal produces a signal frequency above 200 mc.

10. The device of claim 6 wherein the piezoelectric semiconductor body additionally constitutes an ultrasonic delay medium whereby the device simultaneously functions as an ultrasonic delay medium and an acoustic wave amplifier.

11. An isolator comprising a unitary body having both piezoelectric and semiconductor properties, means for propagating an acoustic wave signal through said body thereby generating a significant piezoelectric field and means including a D.C. bias source for simultaneously establishing a D.C. field in said body whereby the D.C. field interacts with the acoustic wave to modify the amplitude of the acoustic wave in a nonreciprocal manner.

12. An ultrasonic circulator comprising a unitary body having both piezoelectric and semiconductor properties, transmitting and receiving means affixed to a first surface of said body for transmitting a first acoustic signal through said body and receiving a second acoustic signal, receiver means affixed to a surface opposite to the said first surface of said body for receiving said first acoustic signal and transmitting means affixed to said opposite surface of said body and spaced from said receiving means for transmitting a second acoustic signal through said body in a direction substantially opposite to the direction of said first acoustic signal such that said second signal is received by said receiving and transmitting means on said first surface, and means associated with said body for establishing a D.C. field having a diminishing intensity across said body in a direction approximately normal to the direction of propagation of the said acoustic signals.

13. An ultrasonic device comprising a unitary body having both piezoelectric and semiconductor properties, a first piezoelectric transducer attached to a first surface of said body, an additional pair of piezoelectric transducers spaced from each other, each attached to surfaces of said body essentially opposite to said first surface and defining two discrete paths between each of said pair of transducers and said first transducer, and means associated with said body for establishing a D.C. field along one of said discrete paths which has a field value different from the other of said discrete paths.

References Cited in the file of this patent

UNITED STATES PATENTS

| | | |
|---|---|---|
| 2,794,863 | Roosbroeck | June 4, 1957 |
| 2,839,731 | McSkimin | June 17, 1958 |
| 2,898,477 | Hoesterey | Aug. 4, 1959 |
| 3,012,211 | Mason | Dec. 5, 1961 |
| 3,090,876 | Hutson | May 21, 1963 |

OTHER REFERENCES

Hutson: "Piezoelectricity and Conductivity," Physical Review Letters, vol. 4, No. 10, May 1960, pages 505–507.